(12) United States Patent
Chen

(10) Patent No.: US 9,902,153 B2
(45) Date of Patent: Feb. 27, 2018

(54) METHOD OF MAKING A PIEZOELECTRIC FILM

(71) Applicant: Xianfeng Chen, Kanagawa (JP)

(72) Inventor: Xianfeng Chen, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 292 days.

(21) Appl. No.: 14/805,739

(22) Filed: Jul. 22, 2015

(65) Prior Publication Data

US 2016/0023466 A1    Jan. 28, 2016

(30) Foreign Application Priority Data

Jul. 28, 2014 (JP) .................. 2014-153349

(51) Int. Cl.
*H01L 41/318* (2013.01)
*B41J 2/16* (2006.01)
*B41J 2/14* (2006.01)

(52) U.S. Cl.
CPC ........... *B41J 2/161* (2013.01); *B41J 2/14233* (2013.01); *B41J 2/164* (2013.01); *H01L 41/318* (2013.01)

(58) Field of Classification Search
CPC ...... C01G 21/00; C01G 23/00; C01G 23/002; C01G 23/003; C01G 25/00; C01G 25/02; C07F 7/00; C07F 7/006; C07F 7/24; C23C 14/08; C30B 29/32; C30B 29/68
See application file for complete search history.

(56) References Cited

U.S. PATENT DOCUMENTS

| | | | | |
|---|---|---|---|---|
| 4,677,336 A * | 6/1987 | Kushida | ................. | H01L 41/29 204/192.18 |
| 5,155,658 A * | 10/1992 | Inam | ................... | C04B 35/491 257/E21.01 |
| 5,491,102 A * | 2/1996 | Desu | ...................... | G11C 11/22 257/E21.009 |
| 5,866,238 A * | 2/1999 | Takayama | .............. | H01L 37/02 428/209 |
| 6,140,746 A * | 10/2000 | Miyashita | ............ | B41J 2/14233 310/358 |
| 6,482,538 B2 * | 11/2002 | Ramesh | ................... | B32B 9/00 257/E21.01 |

(Continued)

FOREIGN PATENT DOCUMENTS

JP     H0124796 B2 *  5/1989
JP      7082097 A  *  3/1995

(Continued)

*Primary Examiner* — Carl Arbes
(74) *Attorney, Agent, or Firm* — Cooper & Dunham LLP

(57) ABSTRACT

A method of making a piezoelectric film includes forming a $PbTO_3$ (PTO) coating film by applying a precursor liquid of a coating film containing PTO as a main ingredient, forming a PTO amorphous layer containing lead titanate as a main ingredient by heating the PTO coating film at a heating temperature lower than a crystallization temperature at which the PTO coating film is crystalized, and forming, on the PTO amorphous layer, a piezoelectric thin-film layer having a main (100) orientation measured by X-ray analysis and containing lead zirconate titanate (PZT) as a main ingredient. The heating temperature is 300° C. or lower.

7 Claims, 8 Drawing Sheets

(56) References Cited

U.S. PATENT DOCUMENTS

| | | | |
|---|---|---|---|
| 7,120,978 B2 * | 10/2006 | Wasa | ............... B41J 2/161 252/62.9 PZ |
| 2014/0216643 A1 | 8/2014 | Chen | |
| 2015/0068673 A1 | 3/2015 | Chen | |

FOREIGN PATENT DOCUMENTS

| JP | 7206442 A * | 8/1995 |
|---|---|---|
| JP | 8094436 A * | 4/1996 |
| JP | 10-219460 | 8/1998 |
| JP | 2005-175099 | 6/2005 |
| JP | 2011-093307 | 5/2011 |

* cited by examiner

METHOD OF MAKING A PIEZOELECTRIC FILM

CROSS-REFERENCE TO RELATED APPLICATIONS

This patent application is based on and claims priority pursuant to 35 U.S.C. § 119(a) to Japanese Patent Application No. 2014-153349, filed on Jul. 28, 2014 in the Japan Patent Office, the entire disclosure of which is hereby incorporated by reference herein.

BACKGROUND

Technical Field

Aspects of this disclosure relate to a method of making a piezoelectric film, a method of making a piezoelectric element, a liquid discharge head, and an image forming apparatus.

Description of the Related Art

Lead zirconate titanate (compositional formula: $Pb(Zr_x, Ti_{1-x})O_3$, hereinafter PZT) is a solid solution of lead zirconate (compositional formula: $PbZrO_3$, hereinafter PZO) and lead titanate (compositional formula: $PbTiO_3$, hereinafter PTO or PT), and has a highest piezoelectric property in a composition near a phase boundary between tetragonal and rhombohedral systems.

Here, the crystal structure of PZT is a perovskite structure and has a high dielectric constant, a large piezoelectricity, and a ferroelectricity. PZT is typically used for, for example, actuators or sensors by utilizing its piezoelectricity. PZT is also used for, e.g., ferroelectric memories (FeRAMs) by utilizing the ferroelectricity.

Examples of a method of making a piezoelectric film (piezoelectric thin-film layer) include a sputtering method and a chemical solution deposition (CSD) method. The CSD method is advantageous in that composition can be more precisely controlled and a larger film area can be uniformly formed at a lower cost than any other method.

It is known that, when a piezoelectric film made of PZT is (100)-oriented, the piezoelectric element has a best piezoelectric performance. Hence, the orientation is controlled by utilizing various crystallized seed layers made of, e.g., $PbTiO_3$ (PTO) or $LaNiO_3$ (LNO).

SUMMARY

In at least one embodiment of the present disclosure, there is provided a method of making a piezoelectric film. The method includes forming a $PbTO_3$ (PTO) coating film by applying a precursor liquid of a coating film containing PTO as a main ingredient, forming a PTO amorphous layer containing lead titanate as a main ingredient by heating the PTO coating film at a heating temperature lower than a crystallization temperature at which the PTO coating film is crystalized, and forming, on the PTO amorphous layer, a piezoelectric thin-film layer having a main (100) orientation measured by X-ray analysis and containing lead zirconate titanate (PZT) as a main ingredient. The heating temperature is 300° C. or lower.

In at least one embodiment of the present disclosure, there is provided a method of making a piezoelectric element. The method includes forming an electrode on the piezoelectric film made by the above-described method to form the piezoelectric element.

In at least one embodiment of the present disclosure, there is provided a method of making a liquid discharge head including the piezoelectric element made by the above-described method.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
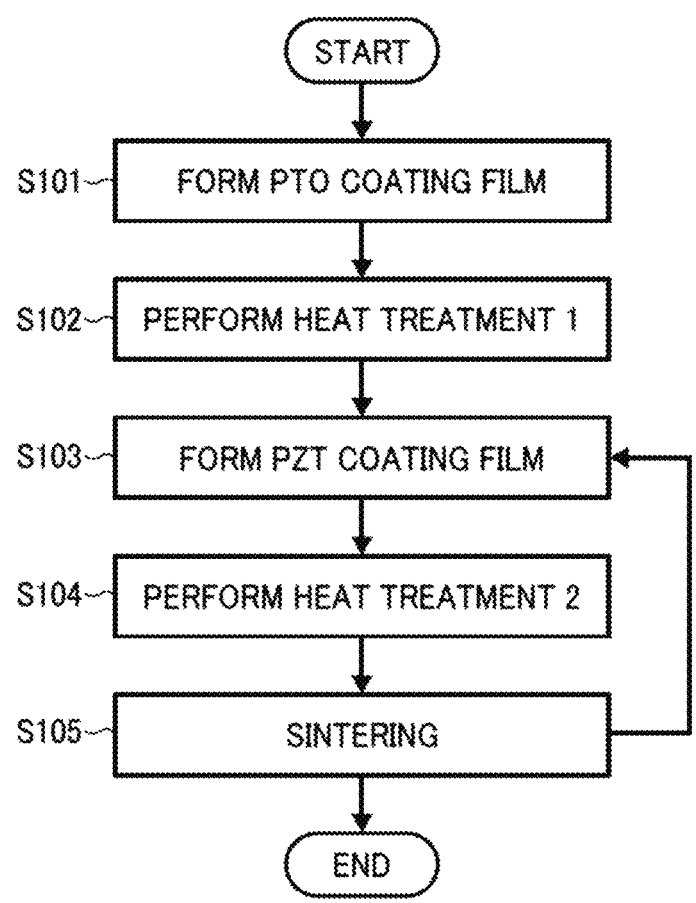
FIG. 1 is a flow chart of a method of making a piezoelectric film according to a first embodiment of this disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

For example, in this disclosure, the term "sheet" used herein is not limited to a sheet of paper and includes anything such as OHP (overhead projector) sheet, cloth sheet, glass sheet, or substrate on which ink or other liquid droplets can be attached. In other words, the term "sheet" is used as a generic term including a recording medium, a recorded medium, a recording sheet, and a recording sheet of paper. The terms "image formation", "recording", "printing", "image recording" and "image printing" are used herein as synonyms for one another. The terms "image formation", "recording", "printing", and "image printing" are used herein as synonyms for one another.

The term "image forming apparatus" refers to an apparatus that ejects liquid on a medium to form an image on the medium. The medium is made of, for example, paper, string, fiber, cloth, leather, metal, plastic, glass, timber, and ceramic. The term "image formation" includes providing not only meaningful images such as characters and figures but meaningless images such as patterns to the medium (in other words, the term "image formation" also includes only causing liquid droplets to land on the medium).

The term "ink" is not limited to "ink" in a narrow sense, unless specified, but is used as a generic term for any types of liquid usable as targets of image formation, such as recording liquid and fixing solution.

The term "image" used herein is not limited to a two-dimensional image and includes, for example, an image applied to a three dimensional object and a three dimensional object itself formed as a three-dimensionally molded image.

The term "image forming apparatus" includes both serial-type image forming apparatus and line-type image forming apparatus.

Although the embodiments are described with technical limitations with reference to the attached drawings, such description is not intended to limit the scope of the disclosure and all of the components or elements described in the embodiments of this disclosure are not necessarily indispensable.

Hereinafter, embodiments of the present disclosure are described with reference to the attached drawings. First, a method of making a piezoelectric film according to a first embodiment of the present disclosure is described with reference to FIGS. 1 through 3. FIG. 1 is a flow chart of a method of making the piezoelectric film according to the first embodiment of the present disclosure. FIGS. 2A through 2E are schematic views of the piezoelectric film. FIG. 3 is a schematic view of an entire layer structure of the piezoelectric film.

<PTO Coating-film Formation Process (S101 Of FIG. 1)>

Figure 2A:
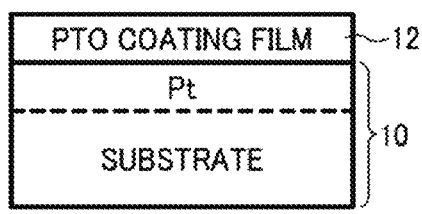
FIGS. 2A through 2E are schematic views of the piezoelectric film made by the method of FIG. 1.
Figure 3:
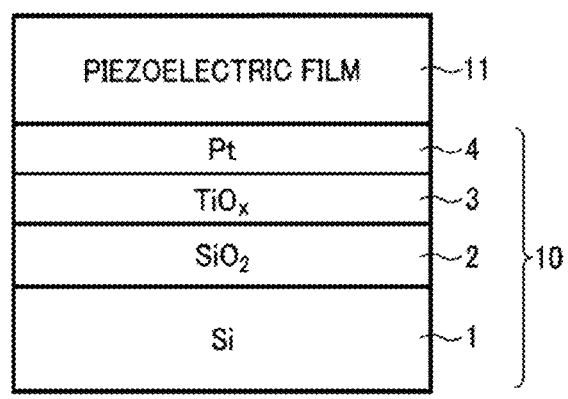
FIG. 3 is a schematic view of an entire layer structure of the piezoelectric film.

As illustrated in FIG. 2A, a PTO coating film 12 is formed on a substrate 10. In this embodiment, as illustrated in FIG. 3, the substrate 10 has a structure in which a $SiO_2$ film 2, a $TiO_x$ film 3, a platinum (Pt) film 4 are laminated in this order.

The PTO coating film 12 can be formed by, e.g., spin coating or an inkjet method of ejecting liquid from a liquid discharge head.

A precursor liquid of the PTO coating film 12 is synthesized by dissolving lead acetate, which serves as a starter, and a titanium alkoxide compound in a common solvent, methoxy ethanol. A solid component concentration of PTO is, for example, 0.03 mol/l. A thickness of a film coated once is not greater than 15 nm. The excess amount of Pb is 10%.

<Heat Treatment 1: Amorphous-layer Formation Process (S102 of FIG. 1)>

Figure 2B:
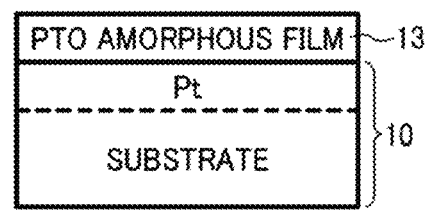

Next, as illustrated in FIG. 2B, a PTO amorphous film 13 which is an amorphous layer serving as a seed layer is formed. In other words, the substrate 10 having the PTO coating film 12 formed thereon is placed on and heated with a hot plate at a temperature lower than a temperature at which the PTO coating film 12 is crystallized. Thus, the PTO amorphous film 13, which is a PTO amorphous layer containing lead titanate as a main ingredient, is formed.

Here, the temperature at which the PTO coating film 12 is crystallized is about 450° C. If the PTO coating film 12 is heated at 450° C. or higher, the crystal structure of the PTO coating film 12 becomes a perovskite structure.

Hence, the PTO coating film 12 is heated at a temperature lower than 450° C. Then, as described below, to obtain a (100)-oriented PZT film with higher XRD intensity, the PTO coating film 12 is heated at a temperature not higher than 300° C., which is also lower than 450° C.

Accordingly, the PTO coating film is not crystallized, and the PTO amorphous film 13 can be obtained which is a film having an amorphous structure serving as a seed layer.

<PZT Coating Layer Formation Process (S103 of FIG. 1)>

Figure 2C:
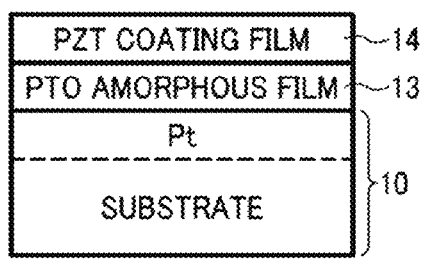

Next, as illustrated in FIG. 2C, a PZT (53/47) coating film 14 is formed on the PTO amorphous film 13 by, for example, a spin coating method.

A precursor liquid of the PZT coating film 14 is synthesized by dissolving lead acetate, which serves as a starter, and a zirconium alkoxide, and a titanium alkoxide compound in a common solvent, methoxy ethanol. A solid component concentration of PZT of the precursor liquid is, for example, 0.3 mol/l.

<Heat Treatment 2 (S104 of FIG. 1)>

The substrate 10 is placed on the hot plate again and heat treatment is performed on the PZT coating film 14 at a low temperature not higher than 500° C.

Figure 2D:
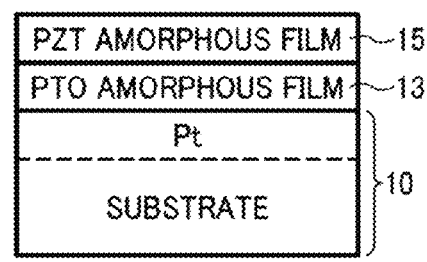

As described above, by setting the heating temperature of the PZT coating film 14 to 600° C. or lower, as illustrated in FIG. 2D, a PZT amorphous film 15 which is a film having an amorphous structure is formed without crystalizing the PZT coating film 14.

<Sintering (S105 of FIG. 1)>

Figure 2E:
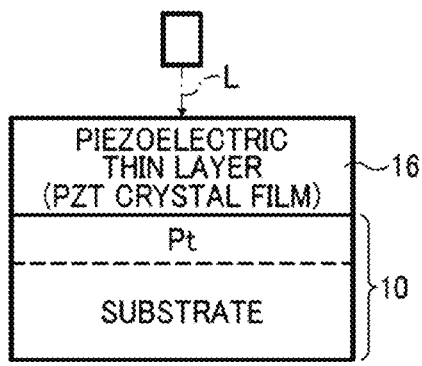

Next, as illustrated in FIG. 2E, a laser annealing process (laser sintering) is performed from above the PZT amorphous film 15, and the PTO amorphous film 13 and the PZT amorphous film 15 are sintered to form a piezoelectric thin-film layer 16 made of a PZT crystal film.

For example, the substrate 10 having the PTO amorphous film 13 and the PZT amorphous film 15 formed thereon is placed on a stage. While moving the stage, a continuous wave laser light L having a flat top (of a wavelength of, e.g., about 980 nm) is irradiated to the PTO amorphous film 13 and the PZT amorphous film 15 for crystallization.

The beam shape of the laser light is, for example, substantially rectangular. The beam size of the laser light irradiated to the PTO amorphous film 13 and the PZT amorphous film 15 is set to, for example, 1 mm×0.35 mm. The scan width of the laser light irradiated to the PTO amorphous film 13 and the PZT amorphous film 15 is set to, for example, 1 mm.

At this time, the laser light around the wavelength of 980 nm is hardly absorbed by the PTO amorphous film 13 and the PZT amorphous film 15, and arrives at the platinum (Pt) film 4 which is an underlayer of the PTO amorphous film 13.

By contrast, the platinum (Pt) film 4 has a quite large absorption coefficient of about $7 \times 10^5$ $cm^{-1}$ around the wavelength of 980 nm. For example, for the platinum (Pt) film having a film thickness of 100 nm, the optical transmittance thereof around the wavelength of 980 nm is one percent or lower. Accordingly, the light energy of the laser light around the wavelength of 980 nm irradiated to the platinum (Pt) film 4 is absorbed by the platinum (Pt) film 4.

The light energy of the laser light absorbed by the platinum (Pt) film 4 is converted to heat and heats the platinum (Pt) film 4. Heat of the platinum (Pt) film 4 is transferred (diffused) to the PTO amorphous film and the PZT amorphous film to crystallize the PZT amorphous film. For example, in the case of scanning at 10 mm/s, the thickness of a PZT crystal film formed by one process is about 30 nm to about 80 nm.

Typically, the crystallization temperature of the PZT amorphous film 15 is about 600° C. to about 850° C., which is significantly lower than the fusion point of platinum (1768° C.). Accordingly, by controlling the energy density and the irradiation time of the laser light incident to the platinum (Pt) film 4, the PZT amorphous film 15 can be crystalized with heat without damaging the platinum (Pt) film 4. The energy density of the laser light is set to, for example, about 100 to about 1000 W/cm². The irradiation time of the laser light is set to, for example, about 1 millisecond (ms) to about 200 milliseconds.

Through the above-described PZT coating-film formation process, heat treatment 2, and sintering (which constitute a piezoelectric thin-film layer formation process), a piezoelectric thin-film layer 16 which is a PZT crystal film is formed. In other words, the piezoelectric thin-film layer 16 is formed that has a preferred (100) orientation and contains lead zirconate titanate (PZT) as a main ingredient.

By repeating PZT film coating, heat treatment, and laser annealing, the thickness of the piezoelectric thin-film layer 16 including PZT is increased (to, for example, about 2 μm).

Here, since the PTO amorphous film 13 is thin, for example, due to diffusion of elements, the PTO coating film 12 may not be separated from the piezoelectric thin-film layer 16 after crystallization and may be united to the piezoelectric thin-film layer 16 which is a PZT crystal film.

As a result, only the piezoelectric thin-film layer 16 made of a PZT crystal film is formed on the platinum (Pt) film 4.

Thus, as illustrated in FIG. 3, a piezoelectric film 11 including one or more piezoelectric thin-film layers 16 is formed on the substrate 10.

Next, heating temperature for a PTO amorphous film in an amorphous-layer formation process is described below.

Figure 4:
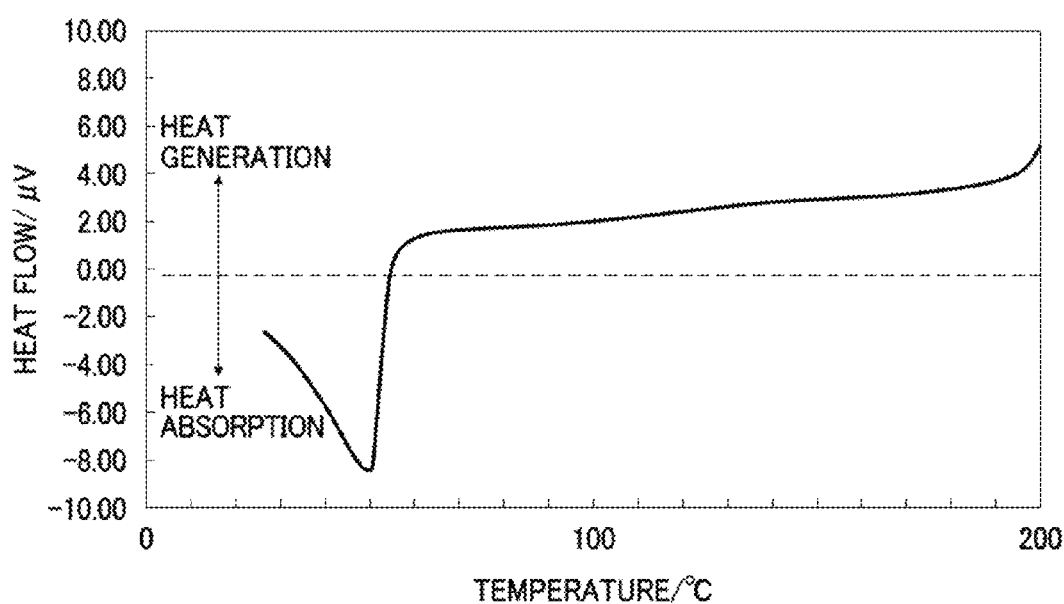
FIG. 4 is a graph of a differential thermal analysis (DTA) curve of a PTO precursor liquid.

FIG. 4 shows a differential thermal analysis (DTA) curve of a PTO precursor liquid. The horizontal axis of FIG. 4 shows heating temperature, in other words, heat absorption or heat generation.

As illustrated in FIG. 4, the heating temperature of the PTO coating film 12 in the amorphous-layer formation process is preferably not lower than about 50° C., which is a first absorption peak of the DTA curve of the precursor liquid.

As the heating temperature rises from a room temperature, i.e., 25° C., the precursor liquid absorbs heat and the curve drops toward a heat absorption side in the vertical axis. The curve reaches the first absorption peak at about 50° C. As the heating temperature rises from 50° C., the precursor liquid generates heat due to combustion or chemical reaction of organic materials in the liquid. Here, when the precursor liquid is heated to 450° C. or higher, the PTO coating film 12 is crystallized.

Hence, in this embodiment, to obtain a (100)-oriented PZT film with higher XRD intensity, the PTO coating film 12 is heated at a temperature not higher than 300° C., which is a temperature lower than 450° C.

Figure 6:
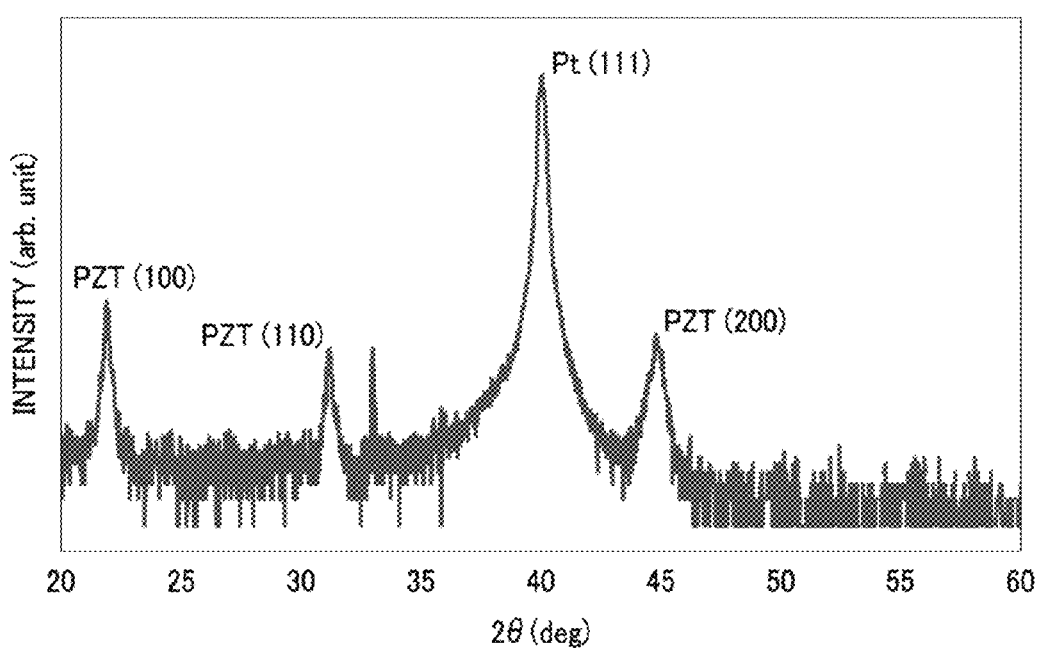
FIG. 6 is a graph of a measuring result of XRD of a piezoelectric film produced by heating a PTO coating film at a room temperature.

In other words, FIG. 6 shows a result of X-ray analysis of samples of the piezoelectric film 11 formed by treating the PTO coating film 12 at the room temperature (25° C.) in FIG. 4. The XRD result is obtained from samples in which the piezoelectric film 11 including the piezoelectric thin-film layer 16 made of a PZT crystal film is formed.

For the piezoelectric film 11 treated at the room temperature, as illustrated in FIG. 6, (100) orientation is a major orientation of the PZT film. However, since the piezoelectric film 11 has a relatively large amount of (110) plane orientation, the (100) orientation ratio is relatively small and the piezoelectric film 11 has a low piezoelectric property.

Figure 5:
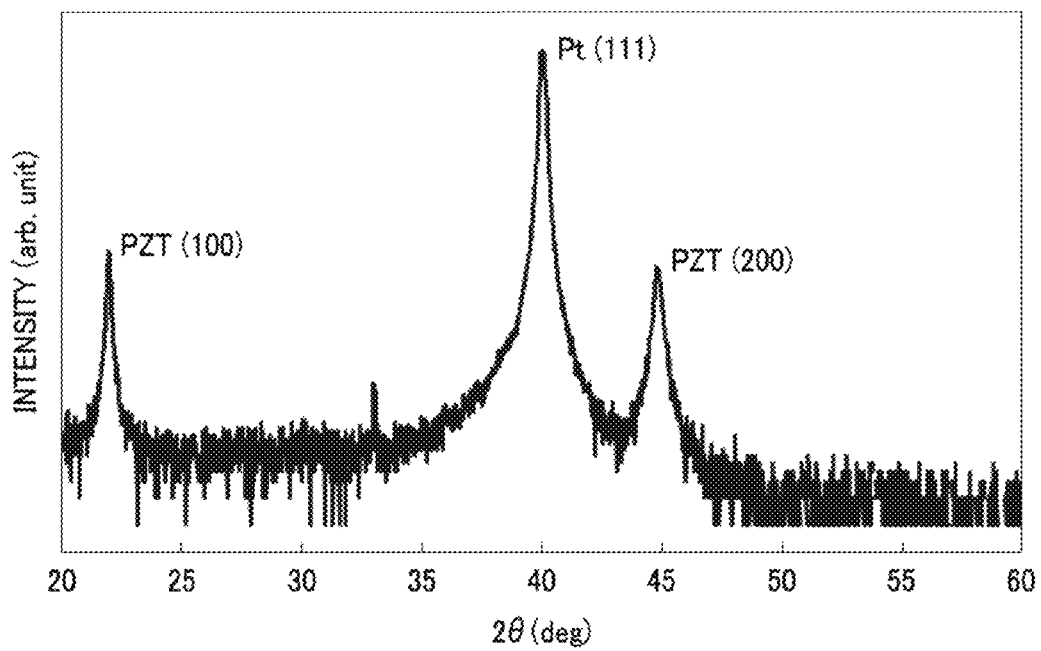
FIG. 5 is a graph of a measuring result of X-ray diffraction (XRD) of a piezoelectric film produced by heating a PTO coating film at 120° C.

Accordingly, it is found that the PTO coating film 12 is preferably heated at a temperature not lower than about 50° C., which is the first absorption peak of the DTA curve of the precursor liquid in FIG. 4. By contrast, FIG. 5 shows a measuring result of X-ray analysis of the piezoelectric film 11 formed by heating the PTO coating film 12 at 120° C. As illustrated in FIG. 5, the piezoelectric film 11 formed by the method according to this embodiment has a 100% (100) orientation. As a result, the piezoelectric film 11 has a high piezoelectric property and, when voltage is applied, displaces more than the piezoelectric film illustrated in FIG. 6.

Accordingly, in the amorphous-layer formation process, the PTO coating film 12 is heated at a temperature of 50° C. or higher and 150° C. or lower, thus obtaining the piezoelectric thin-film layer 16 containing PZT having a 100% (100) orientation, that is, the piezoelectric film 11 made of the piezoelectric thin-film layer 16 including, as a main component, a PZT having a (100) orientation as a main orientation.

In this embodiment, the example in which the excess amount of Pb in PTO is 10% is described above. It is to be noted that PTO may have a different composition if the excess amount of Pb is within a range from 0% to 30%. In addition, the example of PTO is described in this embodiment. In other examples, PTO may contain at least one of La, Nb, Ba, Mn, Fe, Ca, Gd, Sr, and Ce.

In this embodiment, the example in which the surface of the substrate 10 is covered with platinum (Pt) is described above. In other examples, the surface of the substrate 10 may be covered with, for example, Ir, Rh, Ru, Pd, or Cr.

Figure 7:
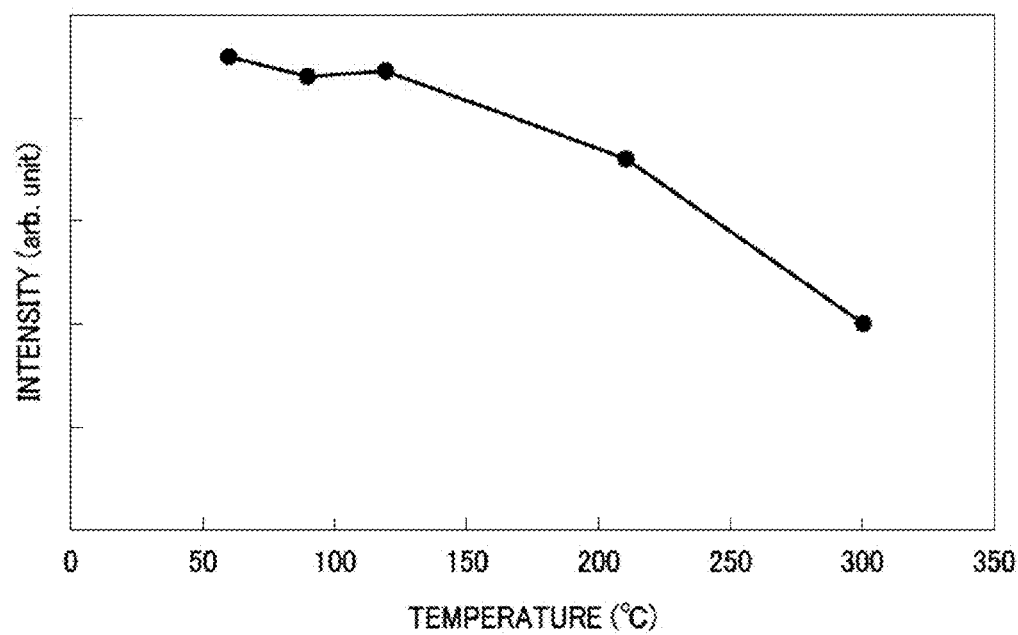
FIG. 7 is an example of variation of PZT (100) XRD peak intensity when the PTO coating film is heated at different temperatures.

Next, FIG. 7 shows an example of variation of PZT (100) XRD peak intensity when the heating temperature to the PTO coating film is changed to different temperatures in the process according to this embodiment.

The heating temperature of the PTO coating film 12 is set to 60° C., 90° C., 210° C., and 300° C.

When the PTO coating film 12 is heated at 60° C., 90° C., 210° C., or 300° C., the PTO coating film 12 has a (100) orientation ratio of 90% or higher.

In addition, as illustrated in FIG. 7, when the PTO coating film 12 is heated at 120° C. or lower, the XRD peak intensity shows substantially the same level. Accordingly, even when the heating temperature varies to an extent, a uniform piezoelectric film can be obtained. However, in FIG. 7, heating at 200° C. or higher causes a reduction in XRD intensity. For example, the (100) peak intensity of a piezoelectric film 11 formed by heating at 300° C. is about 50% of that of a piezoelectric film 11 formed by heating at a temperature of from 60° C. to 120° C.

Accordingly, even if the heating temperature is set to not higher than 450° C. so as not to crystallize the PTO coating film 12, when the PTO coating film 12 is heated at a temperature of 300° C. or higher, the (100) peak intensity of the piezoelectric film 11 is lower than half of that of the piezoelectric film 11 formed by heating at a temperature of from 60° C. to 120° C.

Accordingly, in the amorphous-layer formation process, the PTO coating film 12 is preferably heated at a temperature of 50° C. or higher and 300° C. or lower, which is a first absorption peak of the DTA curve of the precursor liquid. In particular, in the amorphous-layer formation process, the PTO coating film 12 is preferably heated at a temperature of 50° C. or higher and 120° C. or lower.

As a result, a uniform piezoelectric film having a relatively high (100) intensity can be obtained.

Figure 8:
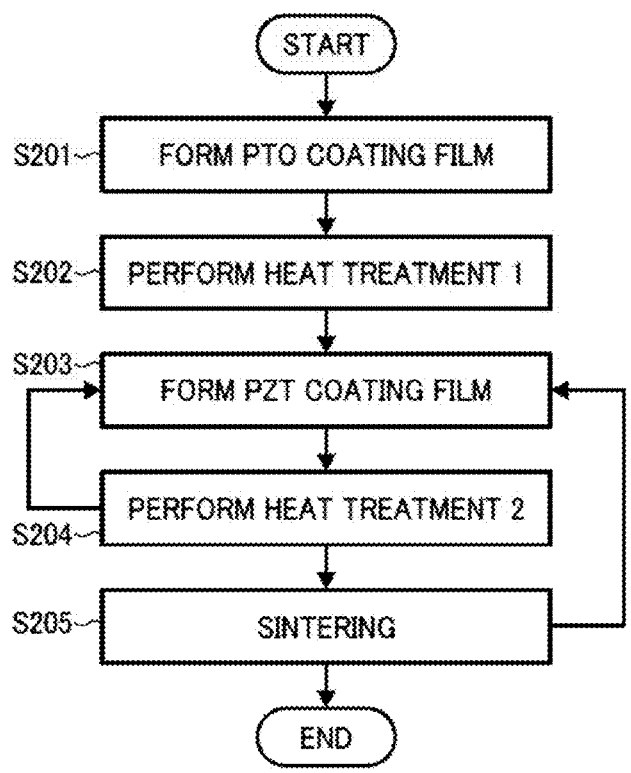
FIG. 8 is a flow chart of a method of making a piezoelectric film according to a second embodiment of this disclosure.

Next, a method of making a piezoelectric film according to a second embodiment of the present disclosure is described with reference to FIG. 8. FIG. 8 is a flow chart of a method of making a piezoelectric film according to this embodiment.

In this embodiment, a piezoelectric thin-film layer containing PZT is formed by a rapid thermal annealing (RTA) process.

That is, at S201, a PTO-coating-film formation process is performed to apply and form a PTO coating film 12 on a substrate 10. At S202, an amorphous-layer formation process is performed to heat the PTO coating film 12 at 120° C. (heat treatment 1) and form a PTO amorphous film 13.

At S203, a PZT coating film 14 is formed on the PTO amorphous film 13 and heated (heat treatment 2).

At S204, the above-described process (from the application to the heat treatment 2) is repeated plural times (e.g., three times), and at S205 sintering is performed at 600° C. or higher according to the RTA.

In addition, a thick film having a desired thickness can be formed by repeating the above-described process.

Figure 9:
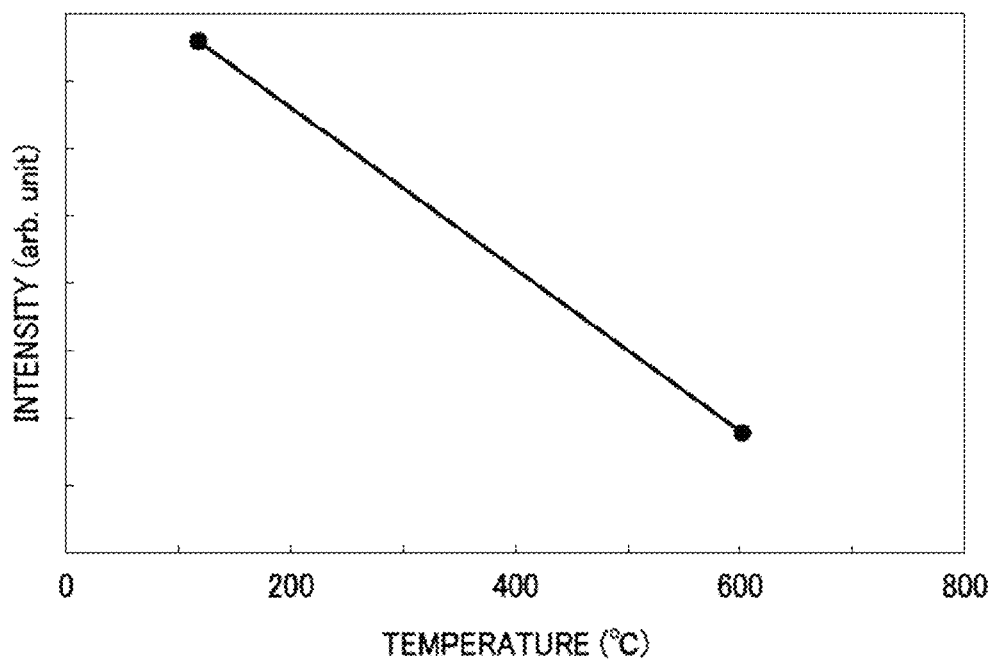
FIG. 9 is a graph of an example of a relationship between treatment temperature of a PTO coating film and PZT (100) XRD intensity.

When the piezoelectric thin-film layer 16 is formed by performing annealing treatment according to the RTA, as illustrated in FIG. 9, like the laser annealing, as the treatment temperature of the PTO amorphous film 13 is higher, the (100) X-ray diffraction intensity of the piezoelectric film 11 made of the piezoelectric thin-film layer 16 containing PZT is lower.

If the heating temperature of the PTO coating film 12 is set to 600° C. at which a PTO coating film is crystalized, the (100) intensity of the piezoelectric film 11 formed could be about one fourth of the (100) intensity of a piezoelectric film 11 heated at 120° C.

Accordingly, for this embodiment, an amorphous layer containing lead titanate as a main ingredient is formed by heating the PTO coating film at a temperature (in this embodiment as well, 300° C. or lower) lower than the temperature at which the PTO coating film is crystallized.

Such a method can obtain about a four times higher (100) intensity of the piezoelectric film 11 than the (100) intensity of the piezoelectric film 11 obtained by a method (of a comparative example) of heating the PTO coating film 12 at 600° C. at which the PTO coating film 12 is crystallized.

Figure 10:
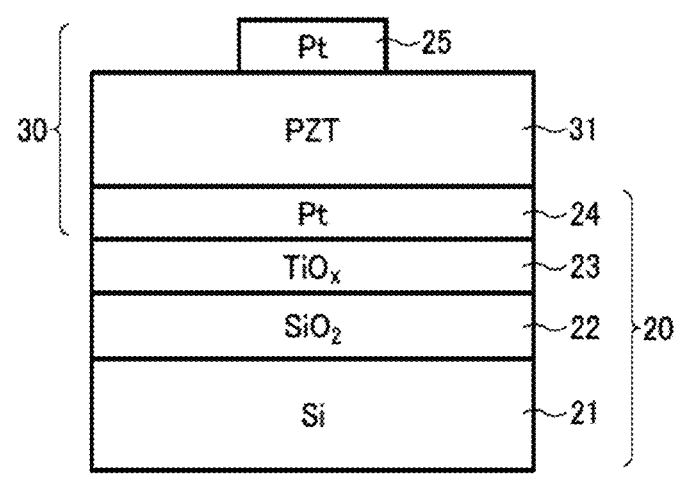
FIG. 10 is a schematic view of a layer structure according to a method of making a piezoelectric element according to an embodiment.

Next, a method of making a piezoelectric film according to an embodiment of the present disclosure is described with reference to FIG. 10. FIG. 10 is a schematic view of a layer structure according to the method of making the piezoelectric element according to this embodiment.

In this embodiment, the piezoelectric element is produced by using a piezoelectric film formed by the method of making the piezoelectric film according to the above-described first embodiment or second embodiment.

First, a silicon (Si) substrate 21 having a thickness of about 500 μm serving as a support substrate is prepared. On one side of the Si substrate 21, a silicon oxidized film ($SiO_2$ film) 22 having a film thickness of about 600 nm, a titanium oxide film ($TiO_x$ film) 23 having a film thickness of about 50 nm, and a platinum (Pt) film 24 having a film thickness of about 100 nm are laminated in this order to form a substrate 20. In the Si substrate 21, an impurity B (Boron) having a concentration of $1\times10^{16}/cm^3$ is doped.

A piezoelectric film 31 made of a multi-layer crystal film (piezoelectric thin-film layer) of a PZT according to first embodiment, for example, PZT (53/47) is formed on the Pt film 24 on the substrate 10.

Next, by, for example, a sputtering method, a platinum (Pt) film 25 serving as an upper electrode having a film thickness of about 100 nm is formed in a predetermined area on the piezoelectric film 31 to form a piezoelectric element 30.

The piezoelectric element has a constant ratio of Zr/Ti and a high piezoelectric constant. The excess amount Pb is appropriate and the piezoelectric element has a good stability.

Figure 11:
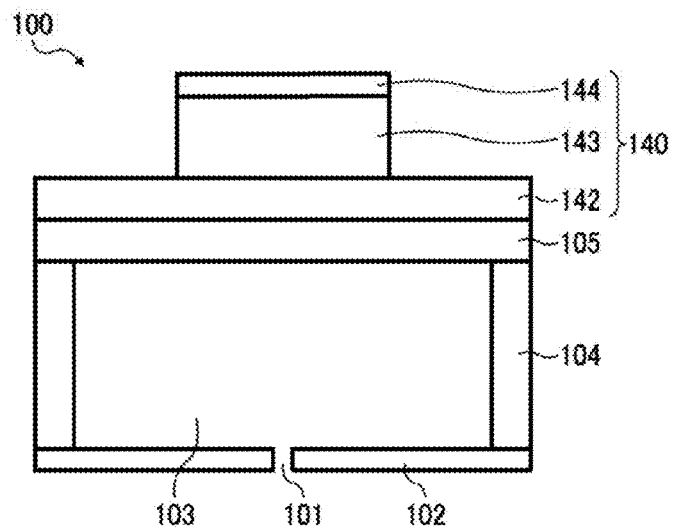
FIG. 11 is a schematic cross-sectional view of an example of a liquid discharge head according an embodiment of this disclosure.

Next, an example of a liquid discharge head according to an embodiment of this disclosure is described with reference to FIG. 11. FIG. 11 is a schematic cross-sectional view of a liquid discharge head 100 according to this embodiment.

The liquid discharge head 100 includes a nozzle substrate 102 including nozzles 101 through which to discharge droplets, a channel substrate 104 to form channels (pressure chambers) communicated with the nozzles 101, and a diaphragm 105 forming walls of the pressure chambers 103.

Piezoelectric actuators made of piezoelectric elements 140 are disposed on a face of the diaphragm 105 opposite the pressure chamber 103.

In each piezoelectric element 140, a first electrode (lower electrode) 142, a piezoelectric film 143, a second electrode (upper electrode) 144 are laminated in this order on the diaphragm 105.

For the liquid discharge head 100, by applying a voltage between the upper electrode 144 and the lower electrode 142, the piezoelectric film 143 extends in an electrode lamination direction, in other words, an electric-field direction and contracts in a direction parallel to the diaphragm 105.

At this time, since the lower electrode 142 is restricted by the diaphragm 105, a tensile stress arises at a side of the diaphragm 105 facing the lower electrode 142 and the diaphragm 105 bends toward the pressure chamber 103 and pressurizes internal liquid, thus discharging droplets from the nozzles 101.

Figure 12:
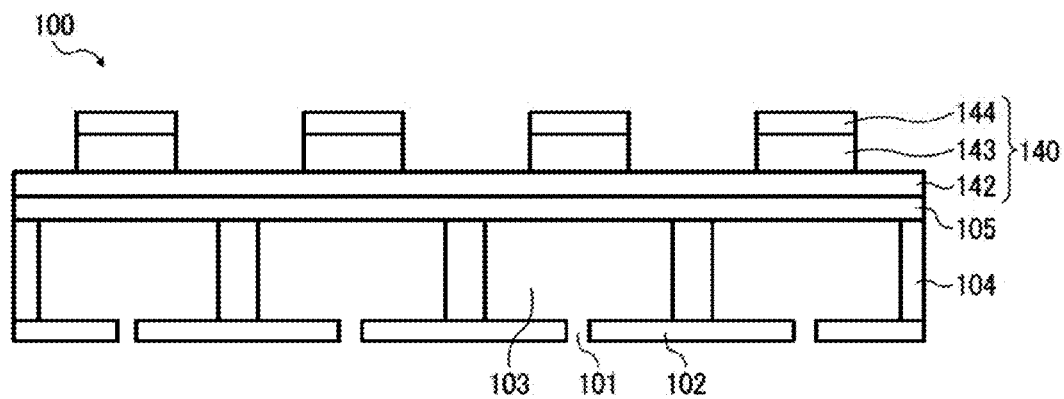
FIG. 12 is a schematic cross-sectional view of a liquid discharge head array according an embodiment of this disclosure.

Next, another example of a liquid discharge head array according to an embodiment of this disclosure is described with reference to FIG. 12. FIG. 12 is a schematic cross-sectional view of a liquid discharge head 100 according to this embodiment.

The liquid discharge head 100 includes four piezoelectric elements 140 sharing a diaphragm 105 and a lower electrode 142 and has a structure of four nozzle rows in which the nozzles 101 are arrayed in four rows.

Figure 13:
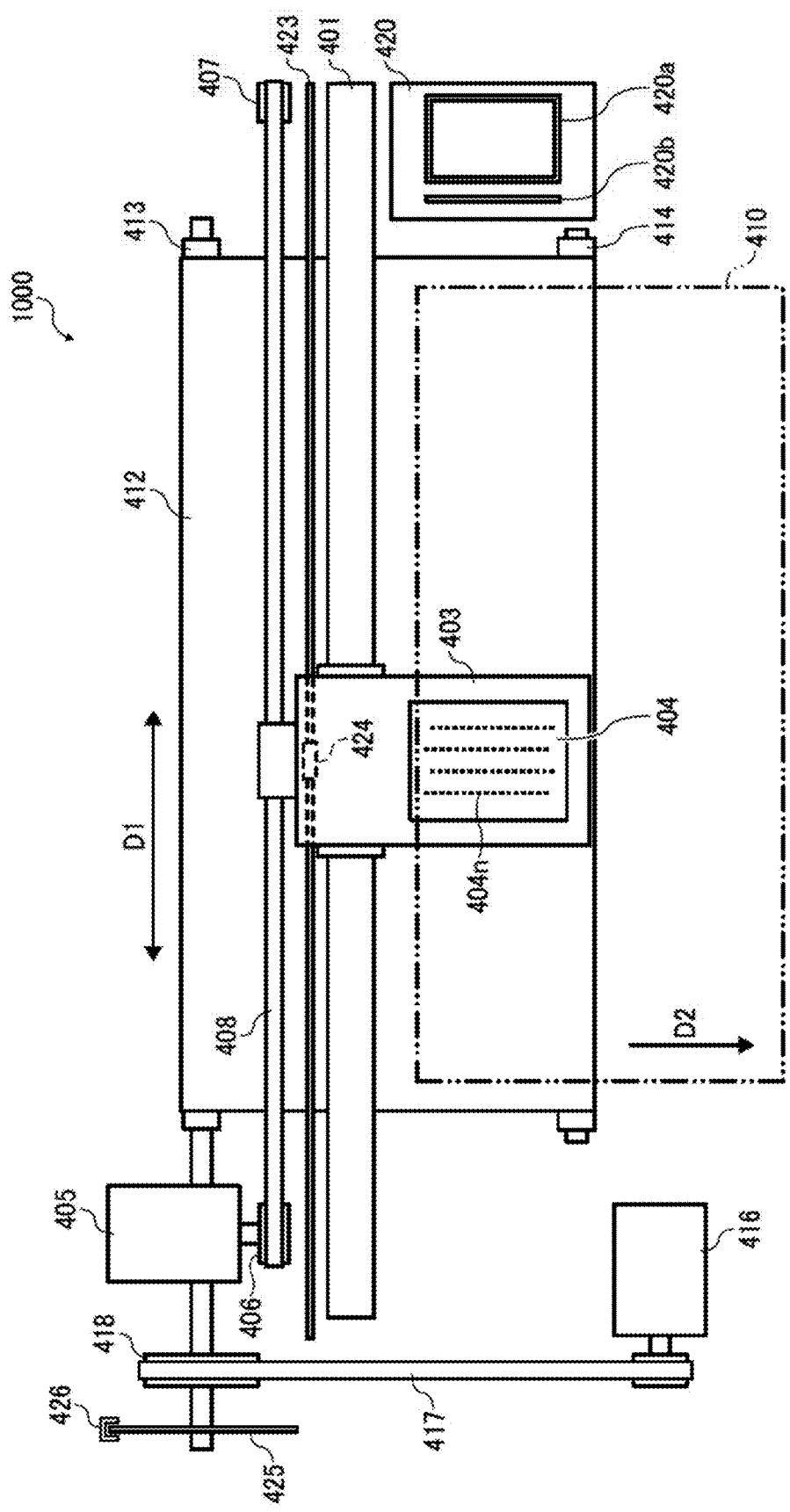
FIG. 13 is a schematic plan view of an example of an image forming apparatus according to an exemplary embodiment of this disclosure.

Next, an example of an image forming apparatus according to an embodiment of this disclosure is described with reference to FIG. 13. FIG. 13 is a schematic plan view of an image forming apparatus 1000 according to this embodiment.

The image forming apparatus 1000 is a serial-type inkjet recording apparatus. A carriage 403 is supported by a main guide rod 401 and a sub guide rod so as to be movable in a direction (main scanning direction) indicated by arrow D1 in FIG. 13. The main guide rod 401 and the sub guide rod are laterally bridged between left and right side plates. A main scanning motor 405 reciprocally moves the carriage 403 for scanning in the main scanning direction (carriage movement direction) D1 via a timing belt 408 extending between a driving pulley 406 and a driven pulley 407.

The carriage 403 mounts a recording head 404 serving as a liquid discharge head according to an embodiment of this disclosure. The recording head 404 includes, for example, four nozzle rows 404n through which to discharge ink droplets of, e.g., yellow (Y), cyan (C), magenta (M), and black (K). The recording head 404 is mounted on the carriage 403 so that the nozzle rows 404n, each of which includes multiple nozzles, are arrayed in a sub-scanning direction indicated by arrow D2 perpendicular to the main scanning direction D1 and ink droplets are discharged downward from the nozzles.

To convey a sheet 410, the image forming apparatus 1000 also includes a conveyance belt 412 serving as a conveyor to electrostatically attract the sheet 410 thereon and convey the sheet 410 to a position opposing the recording head 404. The conveyance belt 412 is an endless belt entrained around a conveyance roller 413 and a tension roller 414. The conveyance roller 413 is rotated by a sub scanning motor 416 via a timing belt 417 and a timing pulley 418, so that the conveyance belt 412 circulates in the sub-scanning direction D2. The conveyance belt 412, while circulating, is charged with a charging roller.

In FIG. 13, the image forming apparatus 1000 further includes a maintenance device (maintenance-and-recovery device) 420 to maintain and recovery the recording heads 404 and a first dummy discharge receptacle to receive droplets discharged during dummy discharge in which droplets not contributing to image formation are discharged from the recording head 404. The maintenance device 420 is disposed at a lateral side of the conveyance belt 412 on one side in the main scanning direction D1 of the carriage 403. The dummy discharge receptacle is disposed at a lateral side of conveyance belt 412 on the opposite side in the main scanning direction Dl.

The maintenance device 420 includes, for example, a cap 420a to cap a nozzle face of the recording head 404, in which the nozzles are formed, and a wiper 420b to wipe the nozzle face of the recording head 404.

An encoder scale 423 with a predetermined pattern is bridged along the main scanning direction D1 between the side plates, and the carriage 403 mounts an encoder sensor 424 serving as a transmissive photosensor to read the pattern of the encoder scale 423. The encoder scale 423 and the encoder sensor 424 forms a linear encoder (main scanning encoder) to detect movement of the carriage 403.

A code wheel 425 is mounted on a shaft of the conveyance roller 413, and an encoder sensor 426 serving as a transmissive photosensor is disposed to detect a pattern of the code wheel 425. The code wheel 425 and encoder sensor 426 forms a rotary encoder (sub-scanning encoder) to detect the movement amount and position of conveyance belt 412.

In the image forming apparatus 1000 thus configured, a sheet 410 is fed from a sheet feed tray onto the conveyance belt 412 charged with the charging roller. With the sheet 410 attracted on the conveyance belt 412, the conveyance belt 412 is circulated to convey the sheet 410 in the sub-scanning direction D2.

By driving the recording head 404 in accordance with image signals while moving the carriage 403, ink droplets are discharged onto the sheet 410, which is stopped below the recording head 404, to form one line of a desired image. Then, the sheet 410 is fed by a predetermined distance to prepare for the next operation to record another line of the image.

Receiving a recording end signal or a signal indicating that the rear end of the sheet 410 has arrived at a recording area, the recording operation finishes and the sheet 410 is output to an ejection tray.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method of making a piezoelectric film, comprising:
   (a) forming a $PbTO_3$ (PTO) coating film by applying a precursor liquid of a coating film containing PTO as a main ingredient, on a substrate;
   (b) forming a PTO amorphous layer containing lead titanate as a main ingredient by heating the PTO coating film, formed in (a), at a heating temperature lower than a crystallization temperature at which the PTO coating film is crystalized, the heating temperature being 300° C. or lower; and
   (c) forming, on the PTO amorphous layer formed in (b), a piezoelectric thin-film layer having a main (100) orientation measured by X-ray analysis and containing lead zirconate titanate (PZT) as a main ingredient.

2. The method according to claim 1, wherein a ratio of the main (100) orientation of the piezoelectric thin-film layer formed in (c) is 90% or higher.

3. The method according to claim 1, wherein the heating temperature in (b) is not lower than a temperature corresponding to a first absorption peak of a differential thermal analysis (DTA) curve of the precursor liquid.

4. The method according to claim 1, wherein the heating temperature in (b) is not lower than 50° C. and not higher than 120° C.

5. The method according to claim 1, wherein the forming the piezoelectric thin-film layer in (c) includes forming the piezoelectric thin-film layer by laser sintering.

6. A method of making a piezoelectric element, comprising forming an electrode on the piezoelectric film made by the method according to claim 1 to form the piezoelectric element.

7. A method of making a liquid discharge head including making a piezoelectric element by performing the method according to claim 6.

* * * * *